US006816353B2

(12) United States Patent
Mani et al.

(10) Patent No.: US 6,816,353 B2
(45) Date of Patent: Nov. 9, 2004

(54) ELECTRONIC ACTUATION FOR MECHANICALLY HELD CONTACTORS

(75) Inventors: Natarajan Mani, Bangalore (IN); Ramadevi Agali, Bangalore (IN); Anilkumar Dinker Pandit, Bangalore (IN); Kadaba Venkatarangan Sridhar, Bangalore (IN); Joseph P. Smith, Dorchester, MA (US); Thuong Huy Phung, Bristol, CT (US); David J. Lesslie, Plainville, CT (US); Sujit Kumar Piri, Bangalore (IN); Chakrapani Shankar Ganesh, R.S. (IN); Dennis Carl Zuffelato, Kensington, CT (US)

(73) Assignee: General Electric Company, Schenectady, NY (US)

( * ) Notice: Subject to any disclaimer, the term of this patent is extended or adjusted under 35 U.S.C. 154(b) by 602 days.

(21) Appl. No.: 09/681,792

(22) Filed: Jun. 6, 2001

(65) Prior Publication Data

US 2002/0060619 A1 May 23, 2002

Related U.S. Application Data

(63) Continuation-in-part of application No. 09/716,655, filed on Nov. 20, 2000, now Pat. No. 6,628,184.

(51) Int. Cl.[7] .............................................. H01H 47/00
(52) U.S. Cl. .................. 361/160; 361/139; 251/129.01
(58) Field of Search ................................ 361/160, 139; 335/132

(56) References Cited

U.S. PATENT DOCUMENTS

| 3,198,910 | A |   | 8/1965  | Burch et al. ................. 335/132 |
| 4,042,966 | A | * | 8/1977  | Newell et al. ................ 361/27  |
| 4,430,579 | A |   | 2/1984  | Wiktor ........................ 307/134 |
| 4,514,677 | A | * | 4/1985  | Kaufman et al. ........... 318/759 |
| 4,703,251 | A | * | 10/1987 | Baumgartner et al. ...... 324/617 |
| 5,510,951 | A | * | 4/1996  | Briedis et al. .............. 361/154 |

* cited by examiner

Primary Examiner—Gregory J. Toatley, Jr.
Assistant Examiner—Boris Benenson
(74) Attorney, Agent, or Firm—Cantor Colburn LLP

(57) ABSTRACT

An electronic circuit for use on a contactor is disclosed. The electronic circuit may be encased in a housing and mounted to a coil cover on the front of a contactor for applying control power to the coil for a selected time period to enable the contactor to change its state and be held in the changed state. Thereafter, the electronic circuit disconnects the supply to the coil thereby preventing coil burn out. The control power is only applied after initiation of an input signal from a switch and after a controller in the electronic circuit has slept for a first predetermined period of time so as not to register any bounce from the input signal. The electronic circuit may include an auxiliary contact status check for providing error free activation of the mechanically held contactor when changing state of the contactor. A contactor employing the electronic circuit of the present invention and a method of using the electronic circuit on a contactor are further disclosed.

37 Claims, 7 Drawing Sheets

ELECTRONIC ACTUATION FOR MECHANICALLY HELD CONTACTORS

CROSS REFERENCE TO RELATED APPLICATIONS

This application is a continuation-in-part of U.S. patent application Ser. No. 09/716,655 entitled "FIELD CONFIGURABLE CONTACTS AND CONTACTOR" filed Nov. 20, 2000 now U.S. Pat. No. 6,628,184, herein incorporated by reference in its entirety.

BACKGROUND OF THE INVENTION

This invention relates generally to contactors. More particularly, this invention relates to electronic actuation for mechanically held contactors.

Contactors, such as lighting contactors, are either electrically or mechanically held contactors used to control, for example, lighting in commercial and industrial applications. Today, a customer must purchase two different products, which are not easily interchangeable to serve both applications. Also, the manufacturer, distributor, and installer must inventory two different products for mechanically and electrically held applications. This drives significant manufacturing cost due to the reduced volume in each line, and cost of inventory. In addition, since the two products are dissimilar, they are not interchangeable in the field, increasing the cost of future retrofit.

To solve the above-described problem, some manufacturers provide an accessory that can be applied to a contactor to mechanically latch the contactor. Although this solves the problem, often the height of the contactor is significantly increased, because this design utilizes a second coil. The second coil also reduces the reliability of the design and adds to the cost and weight of the contactor.

The change of state in mechanically held contactor is normally done by pulsing its coil through a set of interlocking auxiliary contacts. The positioning of these auxiliary contacts is very critical, and can result in contactor malfunction if it is disturbed. Failure of the auxiliary contacts itself is yet another cause for malfunctioning of the contactor.

The switching device that does the pulsing function is yet another source for contactor malfunction. Bounce from the signaling switch, can result in chattering (kissing) on the contacts of the contactor, which can lead to increased arcing and welding of the contactor.

The cutting out of power to the coil of the mechanically held contactor is normally done when the travel of its plunger is almost complete (as the auxiliary contact are set to actuate at this position). If due to any malfunction, travel of the plunger is incomplete, then the auxiliary contactors do not get actuated. Then supply to the coil does not cut out, which results in the coil burnout.

A first known method for actuating a mechanically held contactor by electrical signals includes the use of two separate coils. The first coil being used for activating a plunger to close position and being held at the closed position by spring bias. Thereby the plunger stays in the closed position even if power to the first coil is removed. By activating the other coil (i.e. the second coil) spring bias is removed and the plunger is returned back to original position.

In a second known method, a single coil, which when activa ed pulls a plungert towards a center position with a follow through due to its momentum to the other side. The plunger is held on either side of the center position due to spring bias. Thus by using a single coil, transition from one spring biased state to another is achieved.

However, in both the above known methods, the supply to the coil is cut off through the activation of auxiliary contacts which is achieved by the motion of the plunger. These designs have the problems listed earlier.

SUMMARY OF THE INVENTION

The above discussed and other drawbacks and deficiencies of the prior art are overcome or alleviated by an electronic circuit connectable to a mechanically held contactor. In an exemplary embodiment of the invention, the circuit comprises a switch for providing an input signal, a controller for receiving the input signal and sending an output signal, and, a timing mechanism within the controller for setting a first period of time after receipt of the input signal and for setting a second period of time for limiting duration of the output signal, wherein the output signal is not sent from the controller until the first period of time is completed.

The above discussed and other drawbacks and deficiencies of the prior art are also overcome or alleviated by a contactor changeable in state from ON to OFF and from OFF to ON, the contactor comprising a pair of separable contacts, an assembly for separating and bringing together the pair of separable contacts, an energizable coil for moving the assembly in response to energization and de-energization of the coil, and, an electronic circuit mounted adjacent the coil, the electronic circuit including a timing mechanism for setting a predetermined time period for energization of the coil.

The above discussed and other drawbacks and deficiencies of the prior art are also overcome or alleviated by a method of utilizing an electronic circuit in a mechanical contactor, the method comprising initiating an input signal in the electronic circuit, receiving the input signal within a controller, waiting a first predetermined period of time for avoiding bounce from the input signal, at an end of the first predetermined period of time, sending an output signal from the controller for a duration lasting a second predetermined period of time, and, applying control power to a contact coil of the mechanical contactor during the second predetermined period of time.

The above-discussed and other features and advantages of the present invention will be appreciated and understood by those skilled in the art from the following detailed description and drawings.

BRIEF DESCRIPTION OF DRAWINGS

Referring to the exemplary drawings wherein like elements are numbered alike in the several FIGURES.

DETAILED DESCRIPTION

Figure 1:
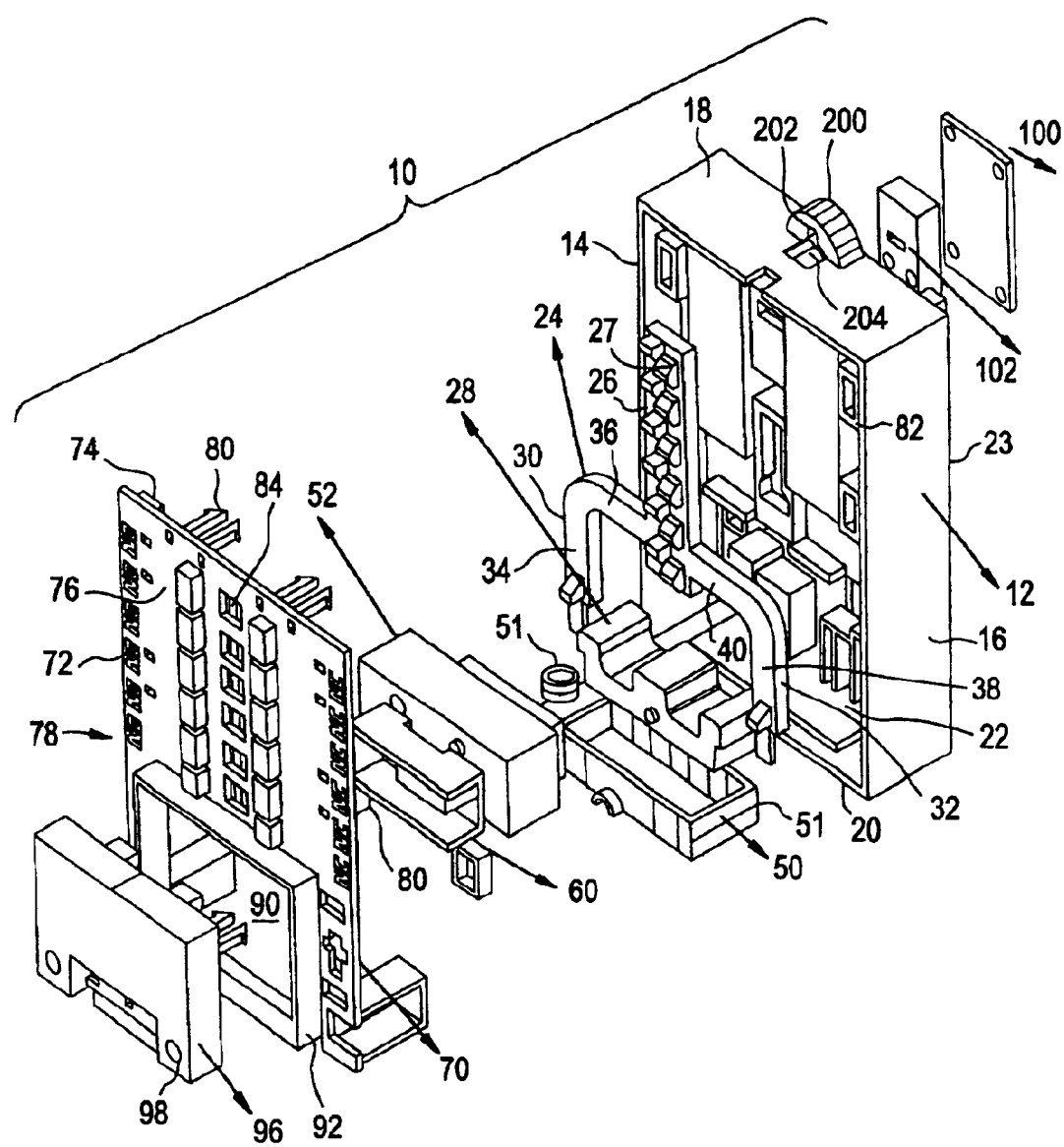
FIG. 1 is an exploded perspective view of a contactor.

Referring to FIG. 1, a contactor 10 includes a base 12 having a first side 14, second side 16, top side 18, and bottom side 20. A front 22 of the base 12 is adapted for receiving a main cam 24 which includes a cam profile leg 26 supporting cam profiles. An armature 28 is positioned between supporting arms 30, 32 of the main cam 24. A first supporting arm 30 includes a first extension 34 adjacent the armature 28 and running generally alongside the first side 14. A first connecting arm 36 extends angularly from the first extension 34 and connects the first extension 34 to the cam profile leg 26 such that a longitudinal axis of the cam profile leg 26 is preferably generally parallel to a longitudinal axis of the first extension 34. Similarly, the second supporting arm 32 includes a second extension 38 running generally parallel to the second side 16 and a second connecting arm 40 extending angularly from the second extension 38 and connecting the second extension 38 to the cam profile leg 26, which is supported to be preferably generally parallel to a longitudinal axis of the second extension 38.

The contactor 10 further preferably includes a bobbin 60 about which a coil (not shown) is wound and which has terminals for fixing connecting wires. A middle limb of the magnet 52 is inserted in the hole of the bobbin 670 from one side, and the magnet along with the bobbin is fitted in the base 12, being inserted through the opening provided in the cover 70. It is held captive within the base through two pins, or other attachment devices, fitted in it and which are held tightly in the base. This permits change or replacement of the coil if necessary even after installation.

Further received in the front 22 of the base 12 is an armature holder 50, which have a generally rectangularly shaped receiving space as shown, for receiving armature 28 therein. The armature 28 is inserted in the armature holder 50 and held captively inside it by a pin driven through the armature 28 and armature holder 50. The assembly of the armature 28 and the armature holder 50 is placed in the base 12 before fitting the cover 70 thereon. After fitment of cover 70, the armature assembly is held under the cover 70 but free to move towards the magnet 52 or away from it, where the magnet 52 is located between the first and second connecting arms 36, 40 of the main cam 24 and the armature assembly 28, 52. In a de-energized state, a gap exists between the magnet 52 and the armature assembly 28, 52. Projections 51 of the armature holder 50 are positioned adjacent (below) the main cam arms 32 and 34. The main cam 24 is pushed towards bottom side 20 of the base 12 by a spring bias. Such springs may be located between a projection on the rear side of the main cam 24 and the base 12. The biased main cam 24 also pushes the armature holder 50 as well as the armature 28 towards the bottom side 20. However, when the coil is energized, the armature 28 and armature holder 50 is pulled towards the magnet 52, thus closing the gap between the magnet 52 and the armature assembly 28, 52. This also results in the main cam 24 being pushed against its spring bias. The magnet 52 is thus positioned within the base to act upon the armature 28, which in turn results in movement of the main cam 24, when the contactor 10 is in an energized state. The motion of the main cam 24 results in a change of state of all contacts in the contact modules. When the coil is de-energized, the spring bias on the main cam 24 pushes it down back towards side 20 which in turn pushes back the armature holder 52 as well as the armature 28, and it also results in all contacts reverting back to their normal state.

Placed over the above-described elements of the contactor 10 and over the front 22 of the base 12 is a cover 70, having an exterior periphery 72 generally matching the exterior periphery of the base 12, which, as shown, may be generally rectangular. The cover 70 includes a rear surface 74 facing the front 22 of the base 12 and a front surface 76 forming the front 78 of the contactor 10. The cover 70 may further include prongs, or pairs of prongs 80 as shown, extending from the rear surface 74 of the cover 70. The prongs 80 may be slightly resiliently biased to form snap-fit projections receivable within detents 82 formed on the front 22 of the base 12. Thus, the cover 70 may be simply snapped onto the base 12, thereby enclosing the elements of the contactor 10 within. Within the cover 70, several openings 84 are provided, each for receiving a cam profile 27 formed upon the cam profile leg 26. That is, when the cover 70 is secured to the base 12, the cam profiles 27 are visible and preferably extend at least partially through opening 84.

The cover 70 further includes a cut out 90 which may have a peripheral lip 92 extending above the front surface 76. The cut out 90 is sized to accept a coil and magnet assembly therein, and is then preferably covered with coil cover 96. The coil cover 96 may also be secured with a snap-fit attachment, screwed on, or otherwise attached thereto.

As further shown in FIG. 1, extending exteriorly from the top side 18 may be a hanger 200 having a key-hole shaped aperture 202 for enabling receipt of a screw or nail head through a larger part of the aperture 202 and hanging the contactor 10 in place by allowing the thinner body of shaft of the screw or nail to slide within the smaller part of the aperture 202. The top side 18 and adjacent rear 23 of the base 12 may include a recess 204 which forms part of the larger part of aperture 202.

A rear 23 of the base 12 may include a latch cover 100 covering a latch assembly 102 adjacent the top side 18 of the base 12 for enabling the contactor 10 to be usable as either a mechanically held or electrically held contactor. The latch assembly 102 is preferably actuated by the main cam 24 through a connector extending rearwardly from the cam profile leg 26. That is, the cam profiles 27 extend from a front surface of the cam profile leg 26 and the connector preferably extends from a rear surface of the cam profile leg 26.

Figure 5:
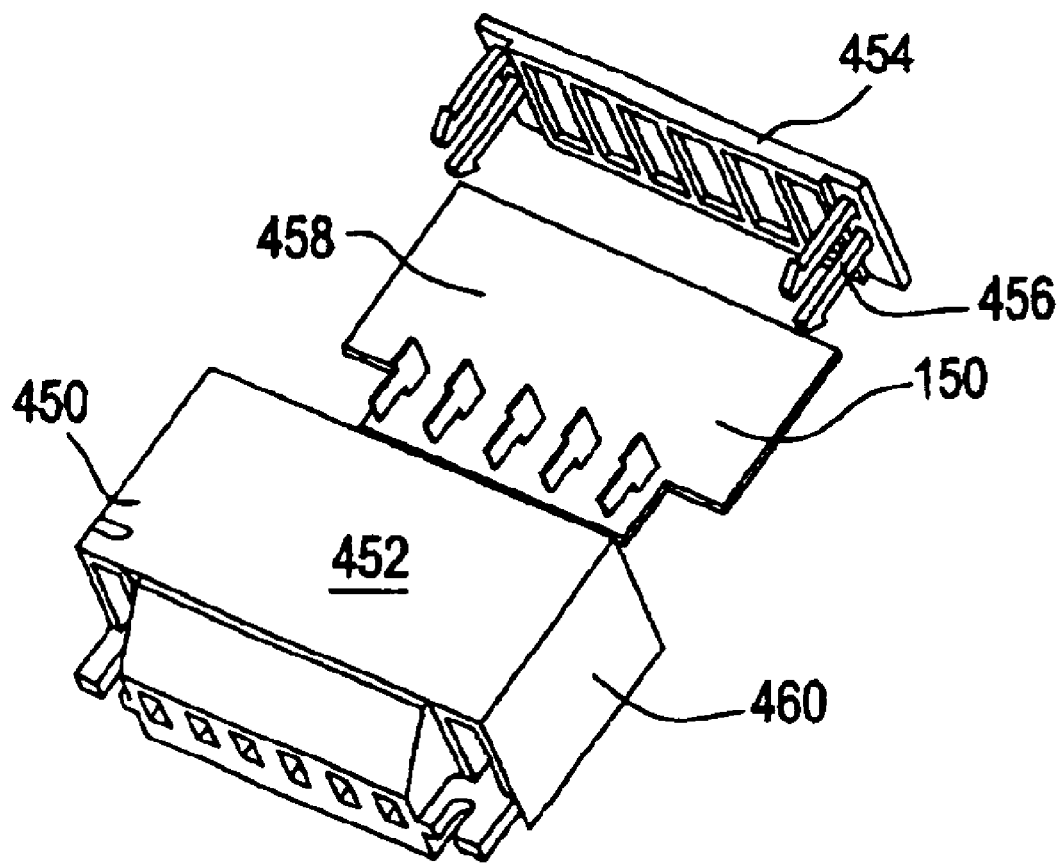
FIG. 5 is an exploded perspective view of a housing for the electronic circuit.
Figure 6:
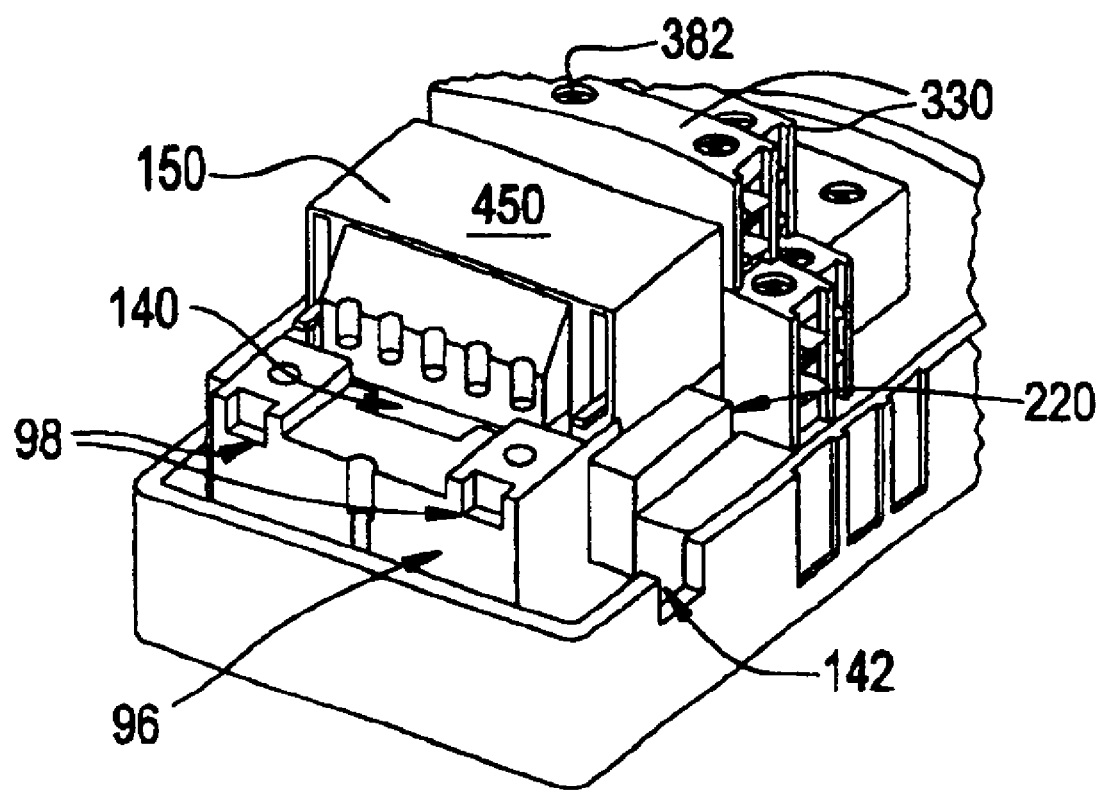
FIG. 6 is a side perspective view of the contactor of FIG. 1 with the electronic circuit of FIG. 5 positioned on the coil cover; and, FIG. 7 is a schematic drawing of the electronic circuit.

With the latch assembly 102 fitted as shown, when the coil of the contactor 10 is energized, the armature 28, armature holder 50, and main cam 24 are moved towards side 18. Consider this as position 1 for the main cam 24 and plunger 107 (FIG. 2 and FIG. 3) of the latch assembly 102. Thereafter, even if the supply to the coil is discontinued, through electronic circuit 150, as shown in FIGS. 5 and 6, the main cam 24 is held towards the side 18 against the spring bias which is trying to push it back towards the side 20. Consider this as position 2 for the main cam 24 and plunger of latch assembly 102. Holding back of the main cam 24 towards side 18 at Position 2, is achieved by the latch assembly 102. From the Position 1, the main cam 24 and plunger move only a small pre-designed distance away to the position 2. At the position 1 or position 2, the profiles on the main cam 24 to actuate the contact modules seated upon the contactor 10 are at the same level. Hence the contacts maintain the same actuated status when the main cam 24 is at position 1 or position 2. However, in position 2, the armature 28 and armature holder 50 return back to the original position (i.e., at the position nearest to side 20 due to gravity or due to a separate spring bias). If at this state the coil is energized again, the armature 28 and armature holder 52 is attracted towards the magnet 52 which pushes the main cam 24 and plunger from the position 2 to the position 1. In this sequence, when the coil is de-energized, the main cam 24 and plunger of the latch assembly 102 is not held at position 2, but instead travels further towards the side 20, at the position 3. The position 3 is the same as the starting position, at which all contacts return to their normal state.

Thus, when the main cam 24 travels from position 3 to position 1 due to coil energization, it goes to position 2 after de-energization of the coil. But, if it travels from position 2 to position 1 due to coil energization, it goes to position 3 after de-energization of the coil. Hence, with successive sequence of energization and de-energization of coil, the main cam 24 can be held in ON or OFF states while keeping the coil de-energized in both states.

Figure 2:
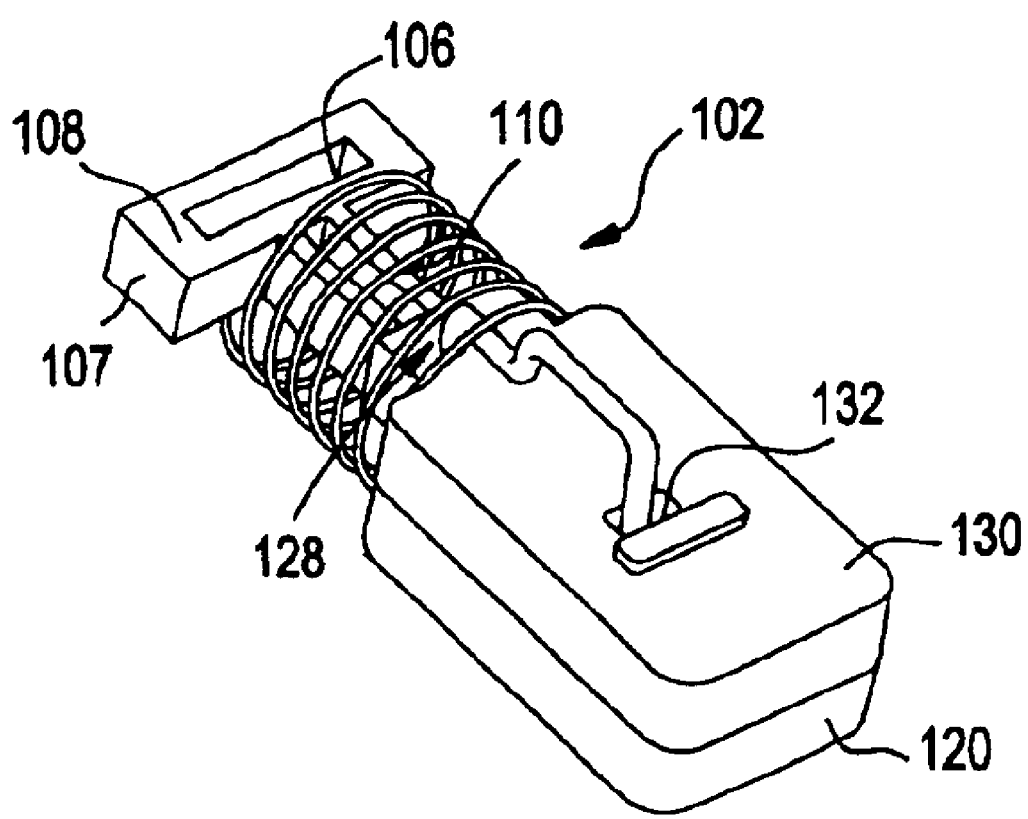
FIG. 2 is a perspective view of the latch assembly.
Figure 3:
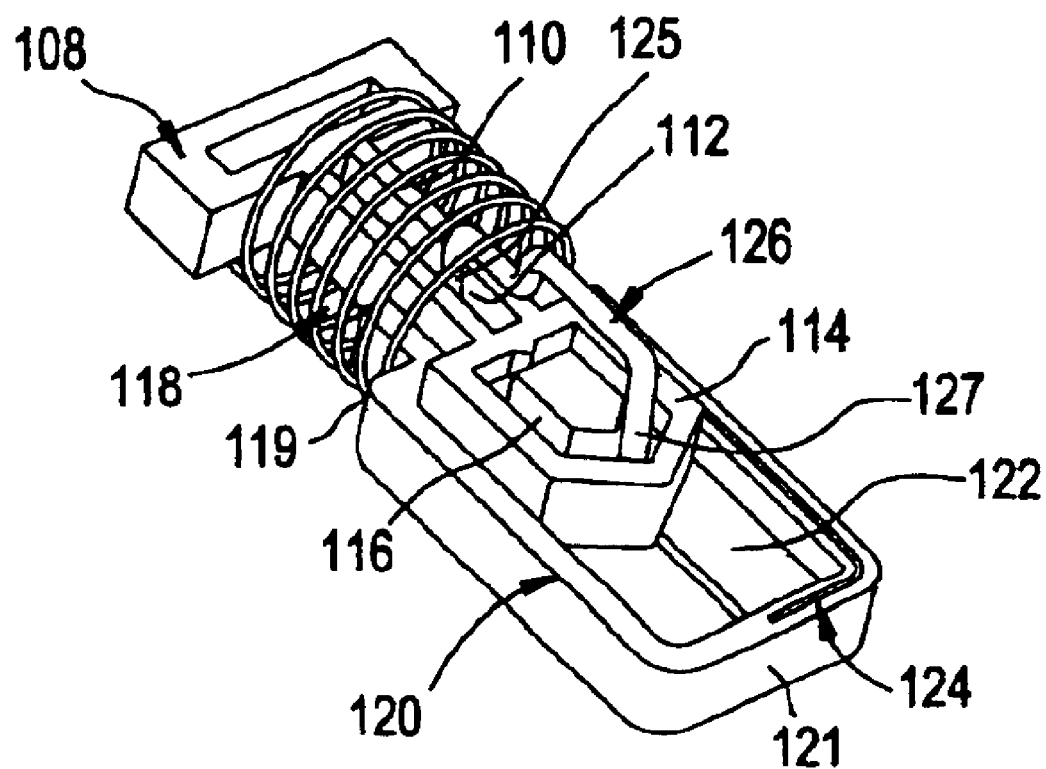
FIG. 3 is a perspective view of the latch assembly of FIG. 2 with the latch cover removed.

Turning now to FIGS. 2 and 3, the latch assembly 102 is shown to include a latch plunger 107. The latch plunger 107 includes a head portion 108 having a slot 106 for accepting the connector extending from the cam leg 26. Thus, movement of the cam leg 26 will correspond with movement of the latch plunger 107. The latch plunger 107 further preferably includes a neck portion 110 having a slot 112 sized to accept the first end 125 of a latching bar 126. Finally, the latch plunger 107 includes a main body portion 114 containing a closed loop pathway 116 for receiving a second end 127 of the latching bar 126. The main body portion 114 of the latch plunger 107 is slidably received in a chamber 122 formed by a latch assembly base 120 and latch assembly cover 130. The main body portion 114 is movable from a bottom end 119 to a top end 121 of the chamber 122. The latching bar 126 extends through opening 128 and rectangular aperture 132 in the latch assembly cover 130. Positioned between the bottom end 119 of the chamber 122 and the head portion 108 of the latch plunger 107 is a return spring 118 which applies pressure on the latching bar 126 and pushes the plunger 107 back after de-latching. An ultrasonic welding nib 124 may be further included on the base 120.

Contactor 10 is capable of accepting any combination or number of contact modules, up to the maximum quantity it is designed for. The contactor shown in FIG. 1 may include a plurality of open spaces, six shown for exemplary purposes only, any number of which may be filled by contact modules 330. The initial state of the contacts contained within the contact module 330 can be changed depending on positioning upon the contactor 10. The contact module 330 could be any standard or non-standard amperage rating, and may have multiple poles (sets of contacts) within it. The attachment is made with either a fastener, or snap fit that allows the installer to add or remove modules on an as needed basis. The contact module 330 contains both stationary and moveable contacts, which enable the contactor 10 to hold any select number of contact modules 330 thereon.

Figure 4:
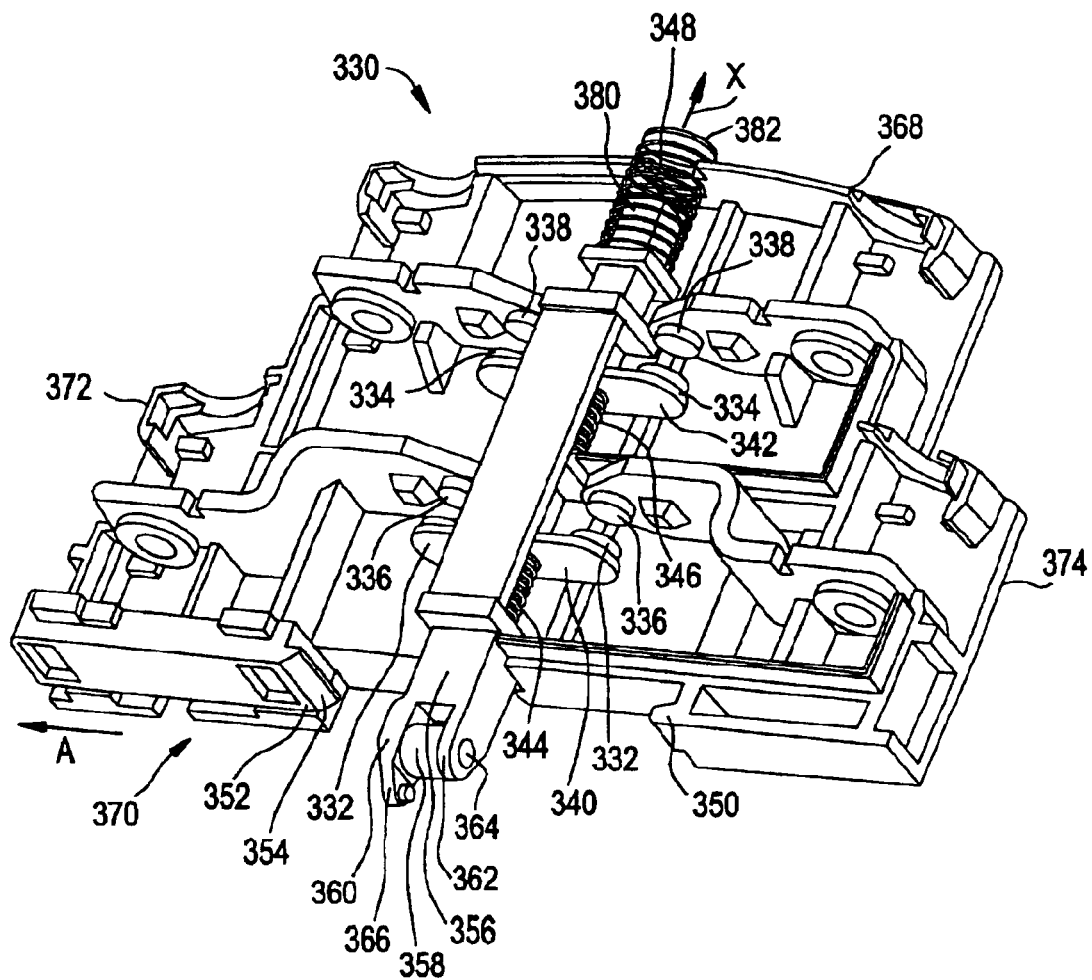
FIG. 4 is a front perspective view of a contact module interior for use with the contactor of FIG. 1 wherein the contact module is biased to have normally open contacts.

In a presently preferred embodiment of a contact module, as shown in FIG. 4, the contacts can be arranged such that they are in a normally closed position when the cam follower is upon a raised surface. The contact module 330 is shown to include two pairs of moveable contacts 332, 334 adapted to abut with two pairs of stationary contacts 336, 338, respectively. The contact module 330 as shown in thus a two-pole contact module, however it is within the scope of this invention to utilize single pole contact modules as well, where only moveable contacts 332 and stationary contacts 336 are utilized. In some cases, it may even be desirable to have more than two-poles of contacts within a single contact module. In the two pole embodiment shown, the moveable contacts 332, 334 are provided on the module plates 340, 342, respectively. The contact module 330 as shown in FIG. 4 is in its normally biased condition, in a normally open state. Springs 344, 346, and 348 bias the contact module in this condition.

Contact module 330 further includes a hook-like projection 350 and a spring biased din clip 352 for securing the contact module to attachment areas on the cover 70. For attachment, an installer need only pull the din clip 352 to the outer side of the contact module 330 in direction A, hook the projection 350 within an attachment area adjacent the first or second side 14, 16 of the contactor 10, and release the din clip 352 so that it returns to its biased condition and seats the projection 354 of the din clip 352 within an attachment area adjacent the other of the first or second side 14, 16.

When the contact module 330 is attached to the contactor 10, the cam follower 356 may either be aligned with the first side or the second side of the cam profile leg 26. The cam follower 356 may include a roller 358 attached between first and second flanges 360, 362 by a pin 364 upon which the roller 358 may freely rotate. The first flange 360 preferably includes an extension 366 which may be seated within a slot on the cam profile leg 26. If the extension 366 is seated within a slot on the first side of the cam profile leg 26, then the contact module 330 will be a "normally closed" contact module because the cam follower 356 will be placed on a raised surface of the cam profile 27 forcing the moveable contacts 332, 334 into contact with the stationary contacts 336, 338. When the contactor is energized, the main cam 24 will move towards the top side 18 and the slope of the cam profile 27 will move underneath the cam follower 356, specifically the roller 358, until the roller 358 is seated upon the flat surface of the cam profile leg 26. Thus, in this energized state, the contacts within the contact module will return to its biased condition where the contacts are open, that is, separated.

To turn the contact module 330 into a "normally open" contact module, the contact module 330 need only be rotated about the axis X (the axis passing through the springs 344, 346, 348) 180 degrees so that the extension 366 may be seated within a slot on the second side of the cam profile leg 26. With the extension 366 seated within a slot on the second side of the cam profile leg 26, the cam follower 356 is positioned on the flat surface of the cam profile leg 26. With the cam follower 356 on the flat surface of the cam profile leg 26, the contact module is in its biased state with the contacts separated. Thus, in this "normal" state of the contactor, the contact module is "normally open". When the contactor is energized, the main cam 24 will again move towards the top side 18 moving the slope of the cam profile 27 underneath the roller 358 until the roller 358 is seated upon the raised surface of the cam profile 27. With the cam follower 356 on the raised surface of the cam profile 27, the module plates 340, 342 are pushed towards an exterior side 368 (opposite an attachment side 370) of the contact module 330 moving the movable contacts 332, 334 into an abutting relation with the stationary contacts 336, 338. Thus, the contacts within the contact module 330 are only closed when the contactor 10 is energized, and thus the contact module 330 with the extension 366 positioned within the slot on the second side of the cam profile leg 26 is "normally open".

Plunger 380 within the contact module 330 moves correspondingly with the cam follower 356, module plates 340, 342, and within the spring 348 along the longitudinal axis X. The plunger 380 is visible through window 382 along exterior side 368 of the contact module 330. Thus, if the plunger 380 is recessed from the window 382, it can be determined that the contacts within are separated and if the plunger 380 is within the window 382 and up against exterior side 368 (i.e. not recessed), then it can be determined that the movable contacts 332, 334 are abutting the stationary contacts 336, 338. Thus, the plunger 380 can be used to indicate contact state.

As described above in FIGS. 1–4, an assembly for separating and bringing together pairs of contacts may include a magnet, an armature, a main cam, and a cam follower within a contact module, as well as other interconnecting parts. The design of such an assembly for separating and bringing together the pairs of separable contacts may be altered according to contactor needs or applications. In response to energization or deenergization of the energizable coil, the energizable coil is able to effect the separation or abutment of the contacts within the contactor through movement of the assembly.

Electrically held contactors will remain closed only while power is applied to the control coil. Mechanically held contactors will remain closed even when control power is removed. They can also be manually operated in the event of a control power circuit failure. The change of state in mechanically held contactor is generally achieved by applying the control supply to the coil and then removing it through a set of auxiliary contacts which change state along with the change of state of the main contacts.

The contactor described herein provides for applying the control power to the coil of mechanically held contactor through an electronic circuit, which applies the control power to the coil for sufficient time period to enable the contactor to change its state and be held in the changed state. Thereafter, the electronic circuit disconnects the supply to the coil.

Since the disconnection of the control power to coil is not dependent on positioning of the auxiliary contacts, it can be done much after the complete travel of the moving parts of the contactors is established and the contactor is stabilized in the altered state. This removes the criticality of positioning the auxiliary contacts and also variations in duration of the time when auxiliary contacts will disconnect the control supply depending on the speed of the plunger. Such variation can result in coil supply being disconnected before the contactor has latched itself completely in the changed state leading to its malfunction. The contactor coils are generally rated for short time duration. If motion of the plunger is blocked due to any reason and the auxiliary contacts do not change state, then the control power to the coil will not be disconnected. This can result in the coil burn out.

The switching device used to signal the control power to the contactor coil, which is often a mechanical switch and can have contact bounce while closing. This can result in interruptions on power supply to the coil, which can bring about chatter on the main contacts of the contactor resulting in loss of their life or their welding.

While a specific embodiment of a contactor 10, latch assembly 102, and contact module 330 has been described above with respect to FIGS. 1–4, it should be understood that the electronic circuit 150 of the present invention could be utilized on alternate embodiments of contactors, contact arrangements, and plungers. FIG. 5 shows an exploded perspective view of one embodiment of a housing 450 for the electronic circuit 150 of the present invention. The dedicated enclosure or housing 450 for the electronic circuit 150 makes for easy and convenient use. After being encased in the housing 450 as shown in FIG. 5, it can be mounted or inserted close to the contactor coil, such as near coil cover 96, and auxiliary contacts 220 so as to facilitate its connection to these for signaling purpose as will be described with respect to FIG. 7. The housing 450 may include a substantially box-shaped portion 452 having an open compartment, hidden from view, for receiving the electronic circuit 150 mounted, for example, on a printed circuit board 458. The printed circuit board 458 may be inserted within the open compartment through an open end 460 and enclosed therein by housing cover 454. Housing cover 454 may include prongs 456, such as two pairs of prongs 456 as shown, for retaining the cover 454 upon the housing 450. The prongs 456 may include outwardly directed hook like projections at the ends opposite the ends which connect to the cover 454. These projections may be received within correspondingly shaped detents within the compartment of the box-shaped portion 452.

FIG. 6 shows a side perspective view of the contactor 10 of FIG. 1 with the electronic circuit 150 and housing 450 of FIG. 5 positioned on the coil cover 96. The electronic circuit 150 will disconnect the coil supply after a predetermined time interval such that the main cam 24 will have by then latched in the energized position. The auxiliary contact block 220 may provide feedback to the electronic circuit 150 as to the contact state for the mechanically held version of the contactor 10. FIG. 6 further shows the apertures 98 for coil terminals and an aperture 140 to view the coil rating which may be marked on the bobbin 60. Additionally, cutouts 142 (one on each side 14, 16) on the base 12 may receive protrusions on the main cam 24 and enable protrusions to be manually accessed through cutouts 142 for manual actuation of the main cam 24. While the contactor 10 may support several contact modules 330, two such contact modules 330 are shown mounted to the contactor 10. Each contact module 330 contains at least one pair of separable contacts. The initial state of the contacts, i.e. whether the contacts contained within a contact module 330 are normally closed (abutting) or normally open (separated), can be changed depending on the positioning of the contact module 330 upon the contactor 10, as described above with reference to FIG. 4 and as fully described within U.S. patent application Ser. No. 09/716,655, which is herein incorporated by reference in its entirety. A window 382 on each contact module 330 can be used to determine contact state within the contact module 330. Manual access to cam 24 through cutouts 142 allow the contacts to be manually separated in the event that the separable contacts become welded together.

Figure 7:
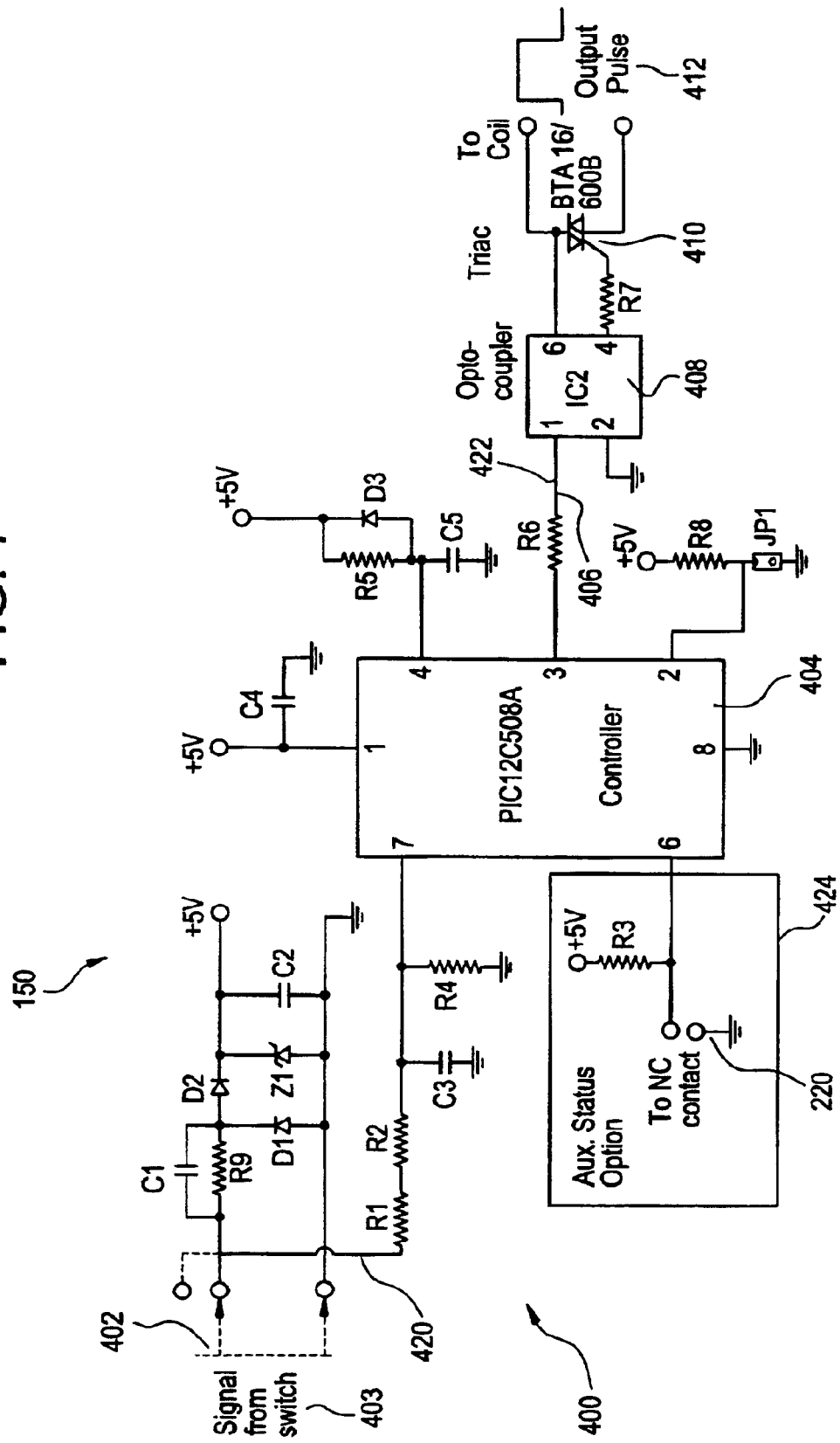

The schematic 400 for the electronic circuit 150 is shown in FIG. 7. In one embodiment, initiation of an input signal 402 (ac or dc), from a switch 403 is sensed by the controller 404 after being transferred over line 420. On being initiated, the controller 404 sleeps (that is, it does not read the input 402) for a pre-determined period of time $t_1$ (for example 25 milli-seconds) so as not to register any bounce from input signal 402. The controller 404 has timing capability and the capability to register the value of time $t_1$ through a program. Thereafter the controller 404 provides a suitable signal 406 over line 422 through the opto-coupler 408 to open the Triac 410 for a pre-determined period of time $t_2$ (for example 60 milli-seconds). This allows the control power to be applied to the contactor coil (marked as Output Pulse 412) for the pre-determined period $t_2$, during which due to the motion of the plunger 107/armature 28, the contactor 10 changes its state (say from OFF to ON position), and gets latched and in its new (that is ON) state.

On subsequent initiation of another input signal 402 from the switch 403, the controller 404 once again, after the sleep period $t_1$ of, for example, 25 milliseconds, opens the Triac 410 for the pre-determined period $t_2$ of, for example, 60 milliseconds. Thereby control power 412 is applied for this duration $t_2$ to the contactor coil, and during this period $t_2$ due to the motion of the plunger 107/armature 28, the contactor 10 changes back to its earlier state (that is from ON to OFF position).

In an alternate embodiment, on initiation of an input signal 402 (ac or dc) from the switch 403, the controller 404 sleeps for the time period $t_1$ as explained in the first embodiment and also additionally checks the status of the auxiliary contact 220, demonstrated within auxiliary status option block 424, and thereafter provides the output pulse 412 only if the auxiliary contact 220 is in the non-activated state. During the output pulse 412 the actuation of the contactor 10 operation is completed and its state is altered (say from OFF to ON). The state of the auxiliary contact 220 is also altered. The contactor 10 is held in this altered state, without the control power 412 being supplied to its coil. The change of status of the auxiliary contact 220 gets registered in the controller 404. If the input signal 402 is withdrawn from the switch 403 after such change of state of the contactor 10 and its auxiliary contacts 220, then input signal 402 is treated as a command to restore the contactor 10 in its original state (that is the OFF state). The controller 404 then (after the pre-determined sleep period $t_1$), provides another output pulse 412 to the coil of the contactor 10 during which the contactor 10 again changes its state and thus goes back from ON to OFF state, also reinstating the earlier status of the auxiliary contact 220. Thus through the second embodiment of the invention, an ON and OFF signal 402 from a switch 403 can be used to provide error free activation of the mechanically held contactor 10 from OFF to ON and then back from OFF to ON state.

Two embodiments of the invention are explained as typical examples, but the use of this invention is not restricted to these two. The scope of this invention therefore covers all variations than can be configured using this scheme of providing a time based pulsed control power to the coil of the mechanically held contactor 10.

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. An electronic circuit for a mechanically held contactor, the contactor changeable in state from ON to OFF or from OFF to ON, the circuit comprising:
   a switch for providing an input signal;
   a controller for receiving the input signal and sending an output signal; and,
   a timing mechanism for setting a first period of time after receipt of the input signal and for setting a second period of time for limiting duration of the output signal;
   wherein the output signal is not sent from the controller until the first period of time is completed; wherein the output signal causes the contactor to change its state.

2. The electronic circuit of claim 1 further comprising an opto-coupler for passing the output signal from the controller.

3. The electronic circuit of claim 2 further comprising a triac openable by the opto-coupler during the second period of time.

4. The electronic circuit of claim 3 wherein an output pulse is passable through the triac when opened, the output pulse lasting the second period of time and causing the contactor to change its state.

5. The electronic circuit of claim 1 further comprising a registry within the controller for a value indicating the duration of the first time period.

6. The electronic circuit of claim 1 further comprising an auxiliary contact status check station connected to the controller, wherein the controller checks status of the auxiliary contact during the first period of time.

7. The electronic circuit of claim 6 wherein the controller alters state of an auxiliary contact during the output signal through the auxiliary contact status check station.

8. The electronic circuit of claim 7 further comprising a registry within the controller for registering a change in state of the auxiliary contact.

9. The electronic circuit of claim 8 wherein the output signal causes the contactor to change its state.

10. A contactor changeable in state from ON to OFF and from OFF to ON, the contactor comprising:
    a pair of separable contacts;
    an assembly for separating and bringing together the pair of separable contacts;
    an energizable coil for moving the assembly in response to energization and de-energization of the coil; and,
    an electronic circuit mounted adjacent the coil, the electronic circuit including a timing mechanism for setting a predetermined time period for energization of the coil;
    wherein the assembly comprises a magnet, an armature, and a main cam.

11. The contactor of claim 10 wherein the electronic circuit includes a controller responsible for the timing mechanism, the controller sending an output signal for energizing the coil.

12. The contactor of claim 11 wherein the controller is responsive to an input signal and the timing mechanism sets a sleep period before the controller sends the output signal.

13. The contactor of claim 12 further comprising an auxiliary contact block and wherein the electronic circuit further comprises an auxiliary contact status check station connected to the controller, wherein the controller checks status of the auxiliary contact block during the sleep period.

14. The contactor of claim 13 wherein the controller alters state of the auxiliary contact block during the output signal through the auxiliary contact status check station.

15. The contactor of claim 14 further comprising a registry within the controller for registering a change in state of the auxiliary contact.

16. The contactor of claim 11 wherein the output signal causes the contactor to change its state.

17. The contactor of claim 11 wherein the electronic circuit further comprises an opto-coupler for passing the output signal from the controller.

18. The contactor of claim 17 wherein the electronic circuit further comprises a triac openable by the opto-coupler during the predetermined time period.

19. The contactor of claim 18 wherein the output signal is passable through the triac when opened, the output signal lasting the second period of time and causing the contactor to change its state.

20. The contactor of claim 10 further comprising a contact module housing the pair of separable contacts.

21. The contactor of claim 20 wherein movement of the main cam initiates separation or abutment of the pair of separable contacts.

22. The contactor of claim 10 wherein the electronic circuit is encased within a housing separate from the contactor.

23. The contactor of claim 22 wherein the housing is mounted upon a coil cover covering the coil.

24. The contactor of claim 22 wherein the housing includes a cutout disposed therein, the cutout positioned proximate to the assembly, the cutout allowing manual access to the assembly.

25. A method of utilizing an electronic circuit in a mechanical contactor, the method comprising:

initiating an input signal in the electronic circuit;

receiving the input signal within a controller;

waiting a first predetermined period of time for avoiding bounce from the input signal;

at an end of the first predetermined period of time, sending an output signal from the controller for a duration lasting a second predetermined period of time; and, applying control power to a contact coil of the mechanical contactor during the second predetermined period of time.

26. The method of claim 25 wherein initiating the input signal comprises moving a switch.

27. The method of claim 26 further comprising sending the input signal over a line connecting the switch and the controller.

28. The method of claim 25 further comprising passing the output signal through an opto-coupler.

29. The method of claim 28 further comprising opening a triac for the second predetermined period of time and allowing the output signal to pass through.

30. The method of claim 25 further comprising changing state of the contactor after applying control power to the contactor coil.

31. The method of claim 25 further comprising checking status of an auxiliary contact during the first predetermined period of time and sending the output signal from the controller only if the auxiliary contact is in a non-activated state.

32. The method of claim 31 further comprising changing state of the auxiliary contact during the second predetermined period of time.

33. The method of claim 32 further comprising registering the state of the auxiliary contact within the controller.

34. The method of claim 33 further comprising withdrawing the input signal after state of the contactor and state of the auxiliary contact have been changed, waiting the first predetermined period of time, sending another output signal to restore the contactor to its original state, and reversing the state of the auxiliary contact.

35. The method of claim 25 wherein the first predetermined period of time is approximately 25 milli-seconds.

36. The method of claim 25 wherein the second predetermined period of time is approximately 60 milli-seconds.

37. The method of claim 25 further comprising disconnecting control power to the contact coil of the mechanical contactor after the second predetermined period of time.

* * * * *